United States Patent
Cheng et al.

(10) Patent No.: US 9,349,768 B2
(45) Date of Patent: May 24, 2016

(54) CMOS IMAGE SENSOR WITH EPITAXIAL PASSIVATION LAYER

(71) Applicant: Taiwan Semiconductor Manufacturing Company, Ltd., Hsin-Chu (TW)

(72) Inventors: Yu-Hung Cheng, Tainan (TW); Tung-Hsiung Tseng, Pingtung County (TW); Cheng-Ta Wu, Chiayi County (TW); Yeur-Luen Tu, Taichung (TW); Chia-Shiung Tsai, Hsin-Chu (TW); Ru-Liang Lee, Hsinchu (TW); Shyh-Fann Ting, Tainan (TW); Jhy-Jyi Sze, Hsin-Chu (TW); Tung-I Lin, Tainan (TW); Wei-Li Chen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/229,348

(22) Filed: Mar. 28, 2014

(65) Prior Publication Data

US 2015/0279894 A1 Oct. 1, 2015

(51) Int. Cl.
*H01L 27/14* (2006.01)
*H01L 27/146* (2006.01)
*H01L 31/0288* (2006.01)
*H01L 31/0336* (2006.01)
*H01L 31/0216* (2014.01)
*H01L 31/18* (2006.01)

(52) U.S. Cl.
CPC ...... *H01L 27/14643* (2013.01); *H01L 27/1461* (2013.01); *H01L 27/1462* (2013.01); *H01L 27/14612* (2013.01); *H01L 27/14614* (2013.01); *H01L 27/14685* (2013.01); *H01L 27/14689* (2013.01); *H01L 27/14698* (2013.01); *H01L 31/0288* (2013.01); *H01L 31/02161* (2013.01); *H01L 31/0336* (2013.01); *H01L 31/1868* (2013.01); *H01L 27/1463* (2013.01)

(58) Field of Classification Search
CPC .................. H01L 27/11502; H01L 27/11507; H01L 28/55; H01L 2924/0002; H01L 29/78; H01L 27/14643; H01L 27/14612; H01L 31/0288; H01L 31/02161; H01L 27/1463; H01L 27/14698
USPC ............................ 257/295, 437, 510, 184, 72
See application file for complete search history.

(56) References Cited

U.S. PATENT DOCUMENTS

| | | | | |
|---|---|---|---|---|
| 2002/0190257 A1* | 12/2002 | Yamazaki et al. | ............... | 257/72 |
| 2008/0057723 A1* | 3/2008 | Park | ............................... | 438/703 |
| 2009/0101949 A1* | 4/2009 | Back et al. | .................... | 257/292 |
| 2009/0258456 A1* | 10/2009 | Hatai | ................................ | 438/75 |
| 2014/0091414 A1* | 4/2014 | Shimotsusa | .................... | 257/431 |

OTHER PUBLICATIONS

U.S. Appl. No. 14/062,838, filed Oct. 24, 2013 by inventors Yu-Hung Cheng, Cheng-Ta Wu, Yeur-Luen Tu, Chia-Shiung Tsai, Ru-Liang Lee, Tung-I Lin, and Wei-Li Cheng for "Semiconductor Device with Trench Isolation", 21 pages of text, 8 pages of drawings.

* cited by examiner

*Primary Examiner* — Chuong A Luu
*Assistant Examiner* — Rodolfo Fortich
(74) *Attorney, Agent, or Firm* — Haynes and Boone, LLP

(57) ABSTRACT

The present disclosure provides a complimentary metal-oxide-semiconductor (CMOS) image sensor (CIS) device. In accordance with some embodiments, the device includes a semiconductor region having a front surface and a back surface; a light-sensing region extending from the front surface towards the back surface within the semiconductor region; a gate stack formed over the semiconductor region; and at least one epitaxial passivation layer disposed at least one of over and below the light-sensing region. In some embodiments, the at least one epitaxial passivation layer includes a p-type doped silicon (Si) layer.

20 Claims, 9 Drawing Sheets

CMOS IMAGE SENSOR WITH EPITAXIAL PASSIVATION LAYER

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array for detecting light and recording intensity (brightness) of the detected light. The pixel array responds to the light by accumulating a charge—the more light, the higher the charge. The charge can then be used (for example, by other circuitry) to provide a color and brightness that can be used for a suitable application, such as a digital camera. Common types of pixel grids include a charge-coupled device (CCD) image sensor or complimentary metal-oxide-semiconductor (CMOS) image sensor (CIS) device.

A CIS device typically includes a light-sensing region within a semiconductor material that transfers energy from photons into electrical energy. The light-sensing region is typically formed in a semiconductor material through an implantation process to form either a p-i-n junction or a p-n junction. The semiconductor material in which the light-sensing region is formed is usually partially made of germanium in addition to silicon. The efficiency at which the CIS device operates is affected by the characteristics of the semiconductor material in which the light-sensing region is formed. The performance of the CIS device can also be affected by the recombination of the electrons with the defects at the surface, such as dangling bonds. It is desirable to improve the operation efficiency and the performance of the CIS device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
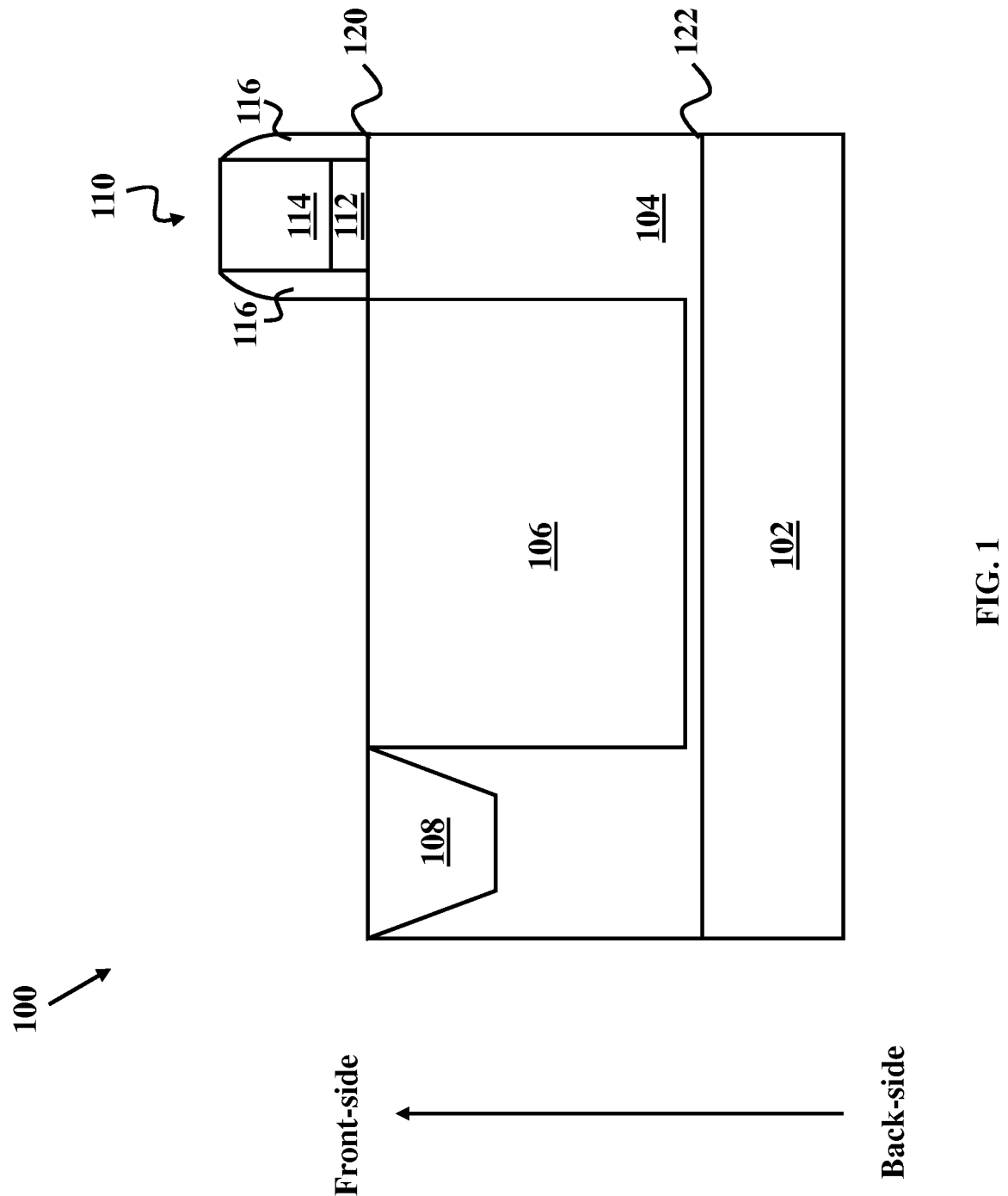
FIG. 1 is a diagrammatic sectional side view illustrating a metal-oxide-semiconductor image sensor (CIS) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagrammatic sectional side view illustrating a metal-oxide-semiconductor image sensor (CIS) device 100 according to some embodiments of the present disclosure. In some embodiments, the CIS device 100 includes a substrate 102. The substrate 102 is sacrificial as the substrate will be thinned down in the following process as discussed in further detail below. The CIS device 100 also includes a semiconductor region 104, a light-sensing region 106, an isolation region 108, and a gate stack 110 as shown in FIG. 1. In some embodiments, the semiconductor region 104 is an upper portion of the substrate.

The substrate 102 includes a semiconductor material such as silicon. Alternatively, the substrate 102 included another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 102 can be used to support an epitaxial growth process to form a sacrificial buffer layer (not shown) over the substrate. An epitaxial process is one in which a semiconductor crystal is grown onto an already existing semiconductor material. The epitaxially grown layer is typically formed through use of a gaseous precursor.

The semiconductor region 104 of the CIS device 100 includes one or more epitaxial grown semiconductor layers. In some embodiments, the semiconductor region 104 includes a silicon (Si) layer, and/or a phosphor (P) doped Si layer. In some embodiments, the semiconductor region 104 includes a Si layer, and a silicon germanium (SiGe) layer. In some embodiments when the semiconductor region 104 includes a SiGe layer, the SiGe layer mains a constant concentration of Ge throughout its thickness. In some embodiments, the SiGe layer has a gradated concentration. In some embodiments, the one or more semiconductor layers are doped with a predetermined level of dopants, for example, an in-situ doping of p-type dopants or n-type dopants. In some embodiments, the dopants include boron (B), phosphor (P) and/or carbon (C). The precursor gases used to provide such in-situ dopants includes $B_2H_6$, $PH_3$, and $CH_3SiH_3$ respectively. In some embodiments, the semiconductor region 104 has a thickness in a range from about 2 μm to about 3 μm. For example, the semiconductor region 104 has a thickness in a range from about 2.2 μm to about 2.6 μm.

Referring to FIG. 1, the CIS device 100 also includes a light-sensing region 106 that extends from the front side of the semiconductor region 104 towards the back side of the semiconductor region 104. The light-sensing region 106 may be formed through an implantation process. In some embodiments, the light-sensing region 106 includes a p-n junction or a p-i-n junction. Various other components may be connected to the light-sensing region 106, for example, transistors and/or other circuit elements may be connected to the light-sensing region 106 to operate in concordance with the light-sensing region 106. In some embodiments as discussed later, after thinning down the substrate 102, the backside of the light-sensing region 106 can be exposed and light can be projected onto the backside of the light-sensing region 106.

The CIS device 100 also includes an isolation region 108 to isolate active regions. The isolation region 108 may be formed using traditional isolation technology, such as shallow trench isolation (STI), to define and electrically isolate the various regions. In some embodiments, the isolation region 108 includes silicon oxide, silicon nitride, silicon oxynitride, an air gap, other suitable materials, or combinations thereof. The isolation region 108 is formed by any suitable process. As one example, the formation of an STI includes a photolithography process, an etch process to etch a trench (for example, by using a dry etching and/or wet etching), and a deposition to fill in the trenches (for example, by using a chemical vapor deposition process) with one or more dielectric materials. In some examples, the filled trench may have a multi-layer structure such as a thermal oxide liner layer filled with silicon nitride or silicon oxide.

Still referring to FIG. 1, the CIS device 100 further includes a gate stack 110 formed over the semiconductor region 104. In some embodiments, the gate stack 110 includes a gate oxide layer 112, a gate electrode layer 114 formed over the gate oxide layer 112, and gate spacers 116 formed along sidewalls of the gate oxide layer 112 and the gate electrode layer 114. In some embodiments, when the gate stack 110 is a dummy gate stack 110, the gate electrode layer 114 includes a polysilicon layer. In some embodiments, the gate electrode layer 112 and/or the gate electrode layer 114 can be formed by a procedure including deposition, photolithography patterning, and etching processes. In some embodiments, the deposition processes includes chemical vapor deposition (CVD), physical vapor deposition (PVD), atomic layer deposition (ALD), or other suitable processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods.

In some embodiments, the gate spacers 116 include a dielectric material such as silicon oxide. Alternatively, the gate spacers 116 include silicon nitride, silicon carbide, silicon oxynitride, or combinations thereof. In some embodiments, the gate spacers 116 are formed by depositing a dielectric material over the gate stack 110 and then anisotropically etching back the dielectric material.

In some embodiments, the photo-induced electrons in the light-sensing region 106 may migrate to the front surface 120 and/or back surface 122 of the semiconductor region 104 to recombine with the defects, for example, the dangling bonds at the surface. The recombination of the electrons may affect the operation efficiency and the performance of the CIS device. Therefore, as shown in FIGS. 2A-2C, 3A-3B, and 4A-4B, in order to prevent the electron migration towards the surfaces of the light-sensing region 106 to recombine with the defects, one or more passivation layers can be formed at the front surface 120 and/or back surface 122 of the semiconductor region 104 to create potential barriers to inhibit the migration of the electrons towards the surfaces.

Figure 2A:
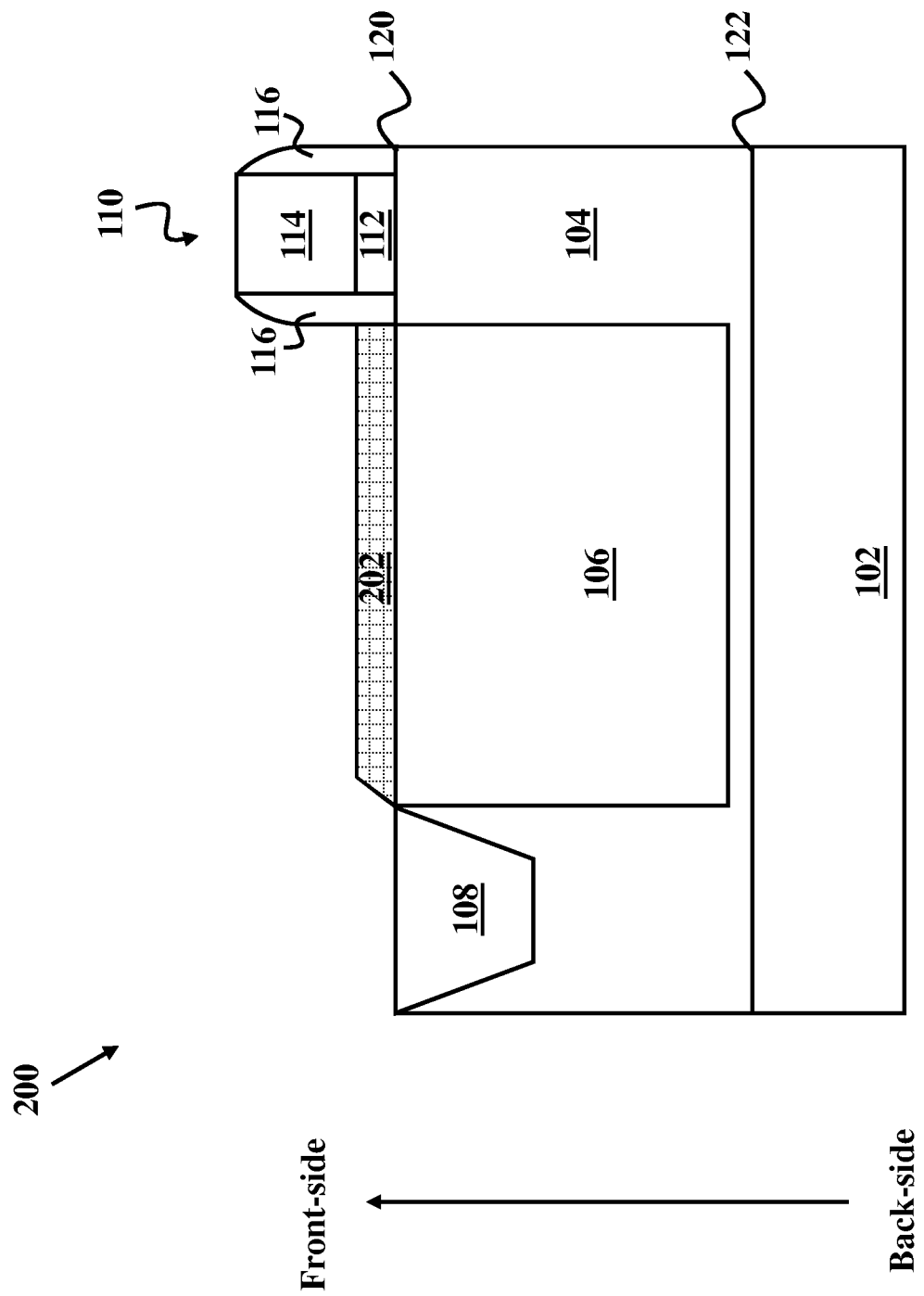
FIGS. 2A-2C, 3A-3B, and 4A-4B are diagrammatic sectional side views of a CIS device including one or more passivation layers, in accordance with some embodiments.

FIG. 2A illustrates a sectional side view of a CIS device 200 including a front passivation layer 202. In some embodiments, the front passivation layer 202 includes a p-typed doped semiconductor layer, such as a boron (B)-doped Si layer. In some embodiments, the concentration of the p-type dopants in the front passivation layer 202 is in a range from about $10^{15}$ atom/cm$^3$ to about $10^{21}$ atom/cm$^3$. In some embodiments, the front passivation layer 202 has a thickness in a range from about 5 nm to about 100 nm. In some preferable embodiments, the front passivation layer 202 has a thickness in a range from about 10 nm to about 20 nm. In some embodiments, the front passivation layer 202 is further doped with carbon (C), and the C dopants can reduce the diffusion of the B dopants in the front passivation layer 202. In some embodiments, the concentration of the B dopants and C dopants in the front passivation layer 202 is in a range from about $10^{15}$ atom/cm$^3$ to about $10^{21}$ atom/cm$^3$.

In some embodiments, the front passivation layer 202 is epitaxially grown on the light-sensing region 106 using an in-situ low-pressure chemical vapor deposition (LPCVD) process by flowing precursor gases into a chamber. Before starting the LPCVD process, the surface of the device precursor is cleaned using a hydrogen fluoride (HF) solution. In some embodiments, the precursor gases used for the LPCVD include one or more gases selected from the group consisting of hydrogen ($H_2$), hydrogen chloride (HCl), dichlorosilane ($H_2SiCl_2$), borane ($B_2H_6$), germanium hydride (GeH$_4$), SiCH$_6$, other suitable gases, and combinations thereof. In some embodiments, the LPCVD is performed at a temperature that is equal to or less than about 750° C. In some embodiments, the pressure used in the LPCVD process is in a range from about 1 Torr to about 500 Torr. In some embodiments before performing the LPCVD process, a photo mask is formed to cover the gate stack 110 and/or the isolation region 108, so that the front passivation layer 202 can be grown in a defined region on the light-sensing region 106. In some embodiments, a sidewall of the epitaxially grown front passivation layer 202 is adjacent to a sidewall of the gate stack as shown in FIG. 2A. The in-situ epitaxial growing process of the passivation layer 202 as discussed in the present disclosure can provide a smooth interface with reduced roughness between the passivation layer and the light-sensing region 106. The process discussed in the present disclosure can also provide an improved crystallinity of the passivation layer 202.

In some embodiments, the epitaxially grown front passivation layer 202 includes one or more selectively controlled crystal orientations. For examples during the LPCVD process, when the ratio between the hydrogen chloride (HCl) gas and the dichlorosilane ($H_2SiCl_2$) is in a range from about 1:6 to about 1:4, the B-doped Si layer may exhibit (001) facet on the edge of the front passivation layer 202. When the ratio between the hydrogen chloride gas and the dichlorosilane gas is in a range from about 1:2.5 to about 1:3.5, the B-doped Si layer may exhibit (111) facet on the edge of the front passivation layer 202. The B-doped Si layer may also exhibit mixed crystal facets of (001)/(111). In some embodiments, the B-doped Si layer may exhibit (311) facet.

In some alternative embodiments, the front passivation layer 202 includes one or more high-k dielectric materials with positive charges that can induce intrinsic negative charges. The induced negative charges can form a potential barrier to effectively prevent the electrons from migrating towards the surface. The high-k dielectric materials may include one or more materials selected from the group consisting of hafnium oxide, hafnium silicon oxide, hafnium silicon oxynitride, hafnium tantalum oxide, hafnium titanium oxide, hafnium zirconium oxide, zirconium oxide, aluminum oxide, hafnium oxide-alumina alloy, other suitable high-k dielectric materials, and/or combinations thereof. In some embodiments, the high-k passivation layer can be formed using a suitable deposition method, such as PVD, ALD, or a sputtering method.

Figure 2B:
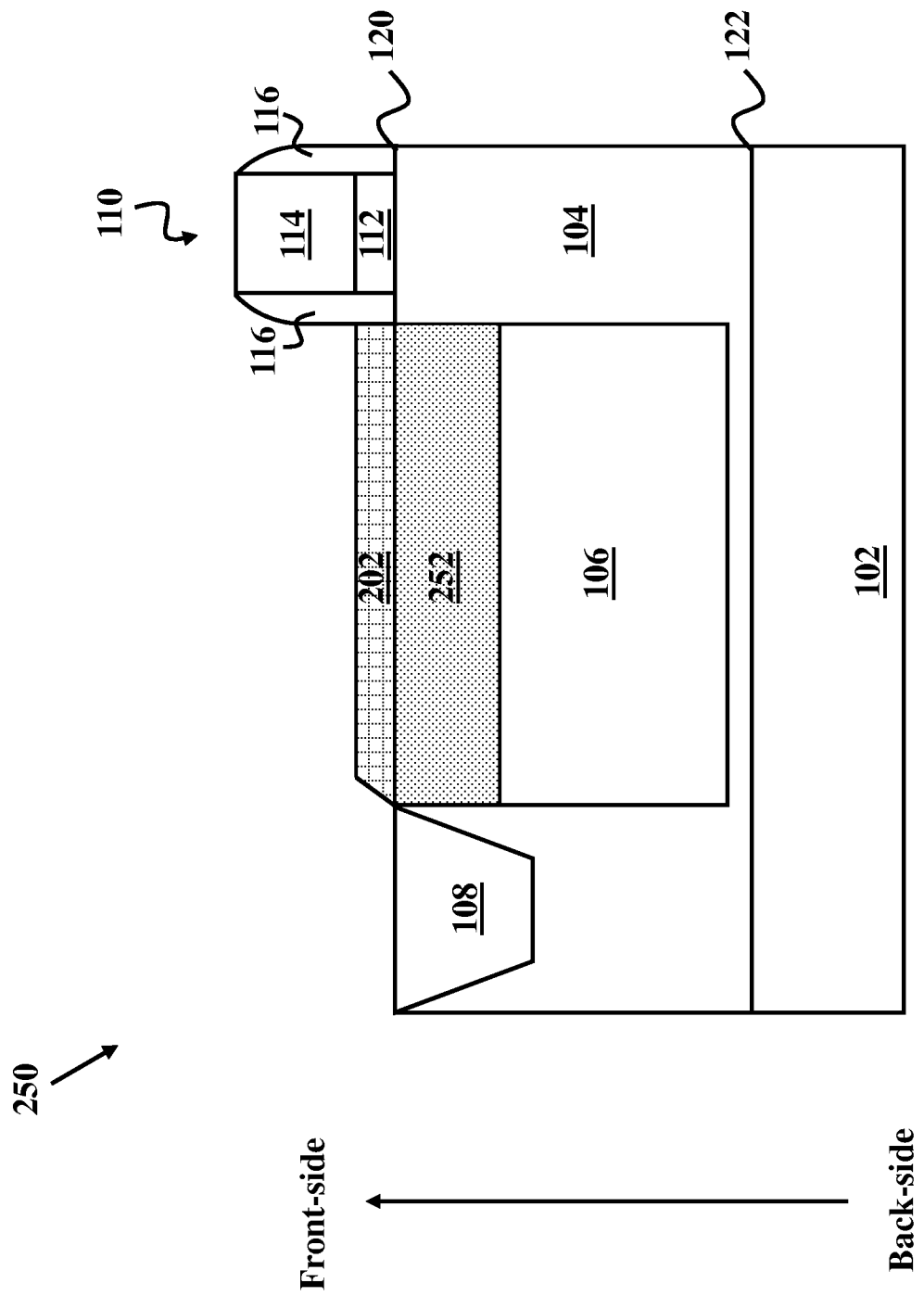

FIG. 2B illustrates a sectional side view of a CIS device 250 including a front passivation layer 202, and a front adsorption layer 252 epitaxially grown between the front passivation layer 202 and the light-sensing region 106 using a LPCVD process. The surface of the device precursor may be cleaned using a hydrogen fluoride (HF) solution prior to the LPCVD process. In some embodiments, before forming the front passivation layer 202, a front adsorption layer 252 is epitaxially grown in the upper portion of the light-sensing region 106. In some embodiments, the front adsorption layer 252 includes an intrinsic SiGe layer, or an n-type doped SiGe layer, such as phosphor (P) doped SiGe layer. In some embodiments, the concentration of the Ge in the SiGe layer is in a range from about 1% to about 100%. The concentration of the n-type dopants, such as phosphor (P) dopants in the doped SiGe layer is in a range from about $10^{15}$ atom/cm$^3$ to about $10^{19}$ atom/cm$^3$. The front adsorption layer 252 can enhance the light absorption of red/near infrared (NIR) spectrum in the CIS device 250. In some embodiments, the front adsorption layer 252 can also prevent the diffusion of the dopants (e.g., B dopants) in the front passivation layer 202. In some embodiments, the total thickness of the front passivation layer 202 and the front adsorption layer 252 is in a range from about 50 nm to about 200 nm.

In some embodiments, the CIS device 250 may include a multilayer structure with a gradient concentration distribution. In an exemplary embodiment, the multilayered light-sensing region 106/front adsorption layer 252/front passivation layer 202 as shown in FIG. 2B may include a structure like phosphor (P) doped SiGe/SiGe/boron (B) doped Si. In some embodiments, the concentration of the Ge in the P doped SiGe layer and/or in the SiGe layer may have a gradient distribution, where the concentration of the Ge increases in a range from about 1% to about 100% along a direction extending from the back-side towards the front-side of the CIS device 250. In some exemplary embodiments, the concentration of Ge in the gradient layer may change from a range from about 1% to about 10%, to a range from about 30% to about 100% along the direction extending from the back-side towards the front-side of the CIS device 250. The concentration of the P dopants in the P doped SiGe layer may be in a range from about $10^{15}$ atom/cm$^3$ to about $10^{19}$ atom/cm$^3$. The multilayered structure with gradient concentration distribution as discussed in the present disclosure may provide improved operation efficiency and performance of the CIS device.

Figure 2C:
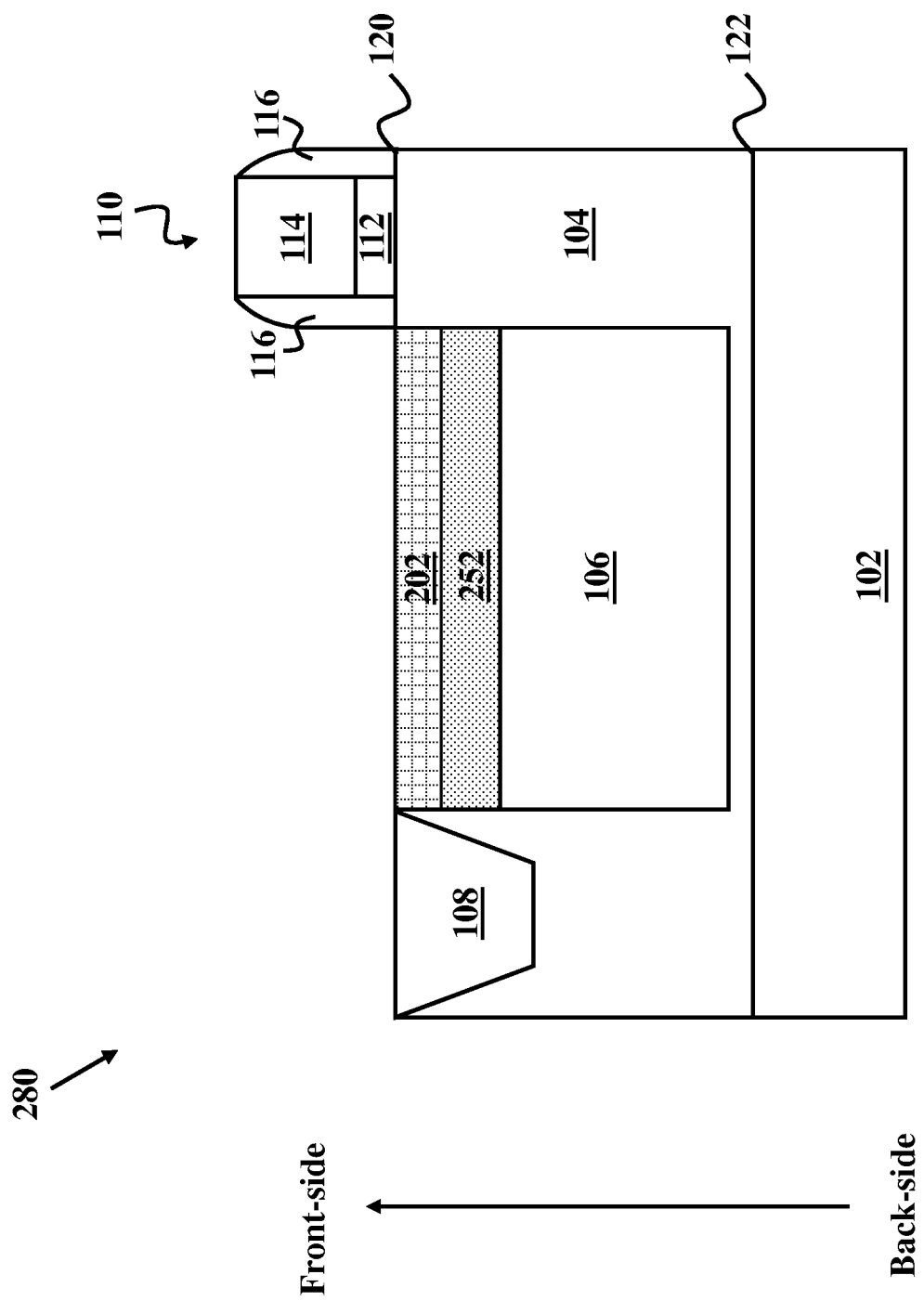

FIG. 2C illustrates a sectional side view of a CIS device 280 including a front passivation layer 202 and a front adsorption layer 252. The CIS device 280 of FIG. 2C may be an alternative embodiment of the CIS device 250 of FIG. 2B. The front passivation layer 202 and/or the front adsorption layer 252 may be epitaxially grown over the light-sensing region 106. In some embodiments after epitaxially growing the front adsorption layer 252 over the light-sensing region 106, an in-situ etching process or an ex-situ etching process may be performed to the front adsorption layer 252 so that the top surface of the front adsorption layer 252 may be lower than the front surface 120. Then the front passivation layer 202 may be epitaxially grown over the front adsorption layer 252 so that a top surface of the front passivation layer 202 may be substantially coplanar with the front surface 120 as shown in FIG. 2C.

Figure 3A:
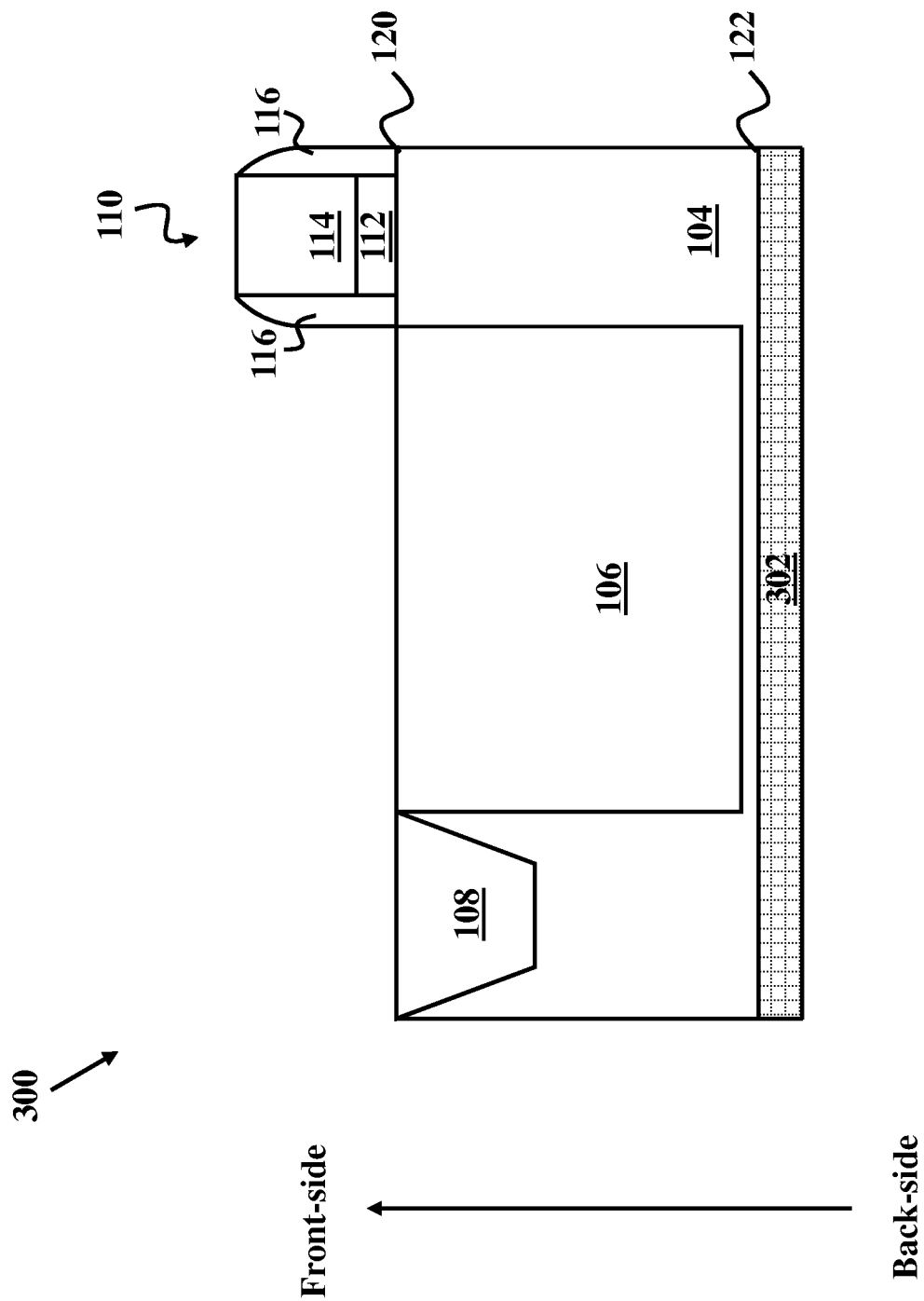

FIG. 3A illustrates a sectional side view of a CIS device 300 including a back passivation layer 302. In some embodiments, before forming the passivation layer 302 on the back surface 122 of the semiconductor region 104, the substrate 102 is thinned down to remove the lower portion of the substrate 102 so that the active regions remain in the CIS device 300. In some embodiments, the thin down process includes a grinding processes and/or a chemical mechanical polishing (CMP) process. The thin down process may also include one or more etching processes. In some embodiments before thinning down the substrate 102, a carrier wafer (not shown) is bonded to the front side of the CIS device 300 to provide a structural support to the other material layers in the CIS device 300.

In some embodiments, the back passivation layer 302 includes a p-type doped semiconductor layer, such as a boron (B)-doped Si layer. In some embodiments, the concentration of the p-type dopants in the back passivation layer 302 is in a range from about $10^{15}$ atom/cm$^3$ to about $10^{21}$ atom/cm$^3$. In some embodiments, the front passivation layer 202 has a thickness in a range from about 5 nm to about 100 nm. In some preferable embodiments, the front passivation layer 202 has a thickness in a range from about 10 nm to about 20 nm. In some embodiments, the back passivation layer 302 is further doped with carbon (C), and the C dopants can reduce the diffusion of the B dopants in the back passivation layer 302. The concentration of the B dopants and C dopants in the back passivation layer 302 is in a range from about $10^{15}$ atom/cm$^3$ to about $10^{21}$ atom/cm$^3$.

In some embodiments, the back passivation layer 302 is epitaxially grown on the back surface 122 of the semiconductor region 104 using an in-situ low-pressure chemical vapor deposition (LPCVD) process by flowing precursor gases into a chamber. Before starting the LPCVD process, the surface of the device precursor is cleaned using a hydrogen fluoride (HF) solution. In some embodiments, the precursor gases used for the LPCVD include one or more gases selected from the group consisting of hydrogen (H$_2$), hydrogen chloride (HCl), high-order silane (e.g., Si$_3$H$_8$), borane (B$_2$H$_6$), germanium hydride (GeH$_4$), SiCH$_6$, other suitable gases, and combinations thereof. In some embodiments, the LPCVD is performed at a temperature that is equal to or less than about 450° C. In some embodiments, the pressure used in the LPCVD process is in a range from about 1 Torr to about 500 Torr. As discussed with regard to the front passivation layer 202, the in-situ epitaxial growing process can provide a smooth interface with reduced roughness and an improved crystallinity of the back passivation layer 302. In some alternative embodiments, the back passivation layer 302 includes one or more high-k dielectric materials that are substantially similar to the high-k dielectric materials in the front passivation layer 202.

Figure 3B:
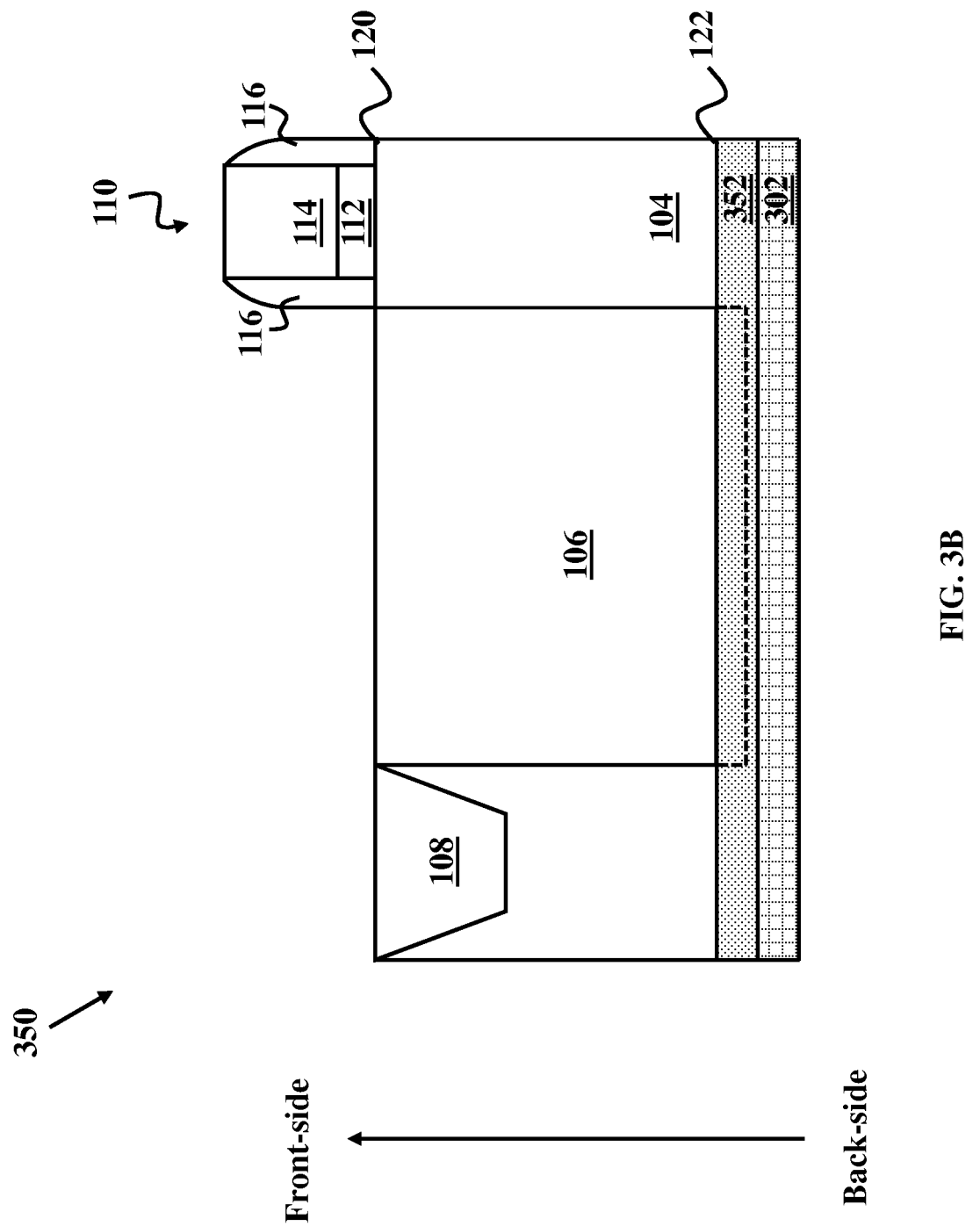

FIG. 3B illustrates a sectional side view of a CIS device 350 including a back passivation layer 302, and a back adsorption layer 352 epitaxially grown between the back passivation layer 302 and the semiconductor region 104 using a LPCVD process. The surface of the device precursor may be cleaned using a hydrogen fluoride (HF) solution prior to the LPCVD process. In some embodiments, before forming the back passivation layer 302, a back adsorption layer 352 is epitaxially grown in the lower portion of the semiconductor region 104. In some embodiments, the back adsorption layer 352 includes an intrinsic SiGe layer, or a n-type doped SiGe layer, such as phosphor (P) doped SiGe layer. In some embodiments, the concentration of the Ge in the SiGe layer is in a range from about 1% to about 100%. The concentration of the n-type dopants, such as phosphor (P) dopants in the SiGe layer is in a range from about $10^{15}$ atom/cm$^3$ to about $10^{19}$ atom/cm$^3$. The back adsorption layer 352 may enhance the light absorption of red/near infrared (NIR) spectrum in the CIS device 350. The back adsorption layer 352 may also prevent the diffusion of the p-type dopants (e.g., B dopants) in the back passivation layer 302. In some embodiments, the total thickness of the back passivation layer 302 and the back adsorption layer 352 is in a range from about 50 nm to about 200 nm. In some embodiments, the CIS device 350 may include a multilayer structure with a gradient concentration distribution that is substantially similar to that of the CIS device 250 as discussed earlier in the present disclosure.

Figure 4A:
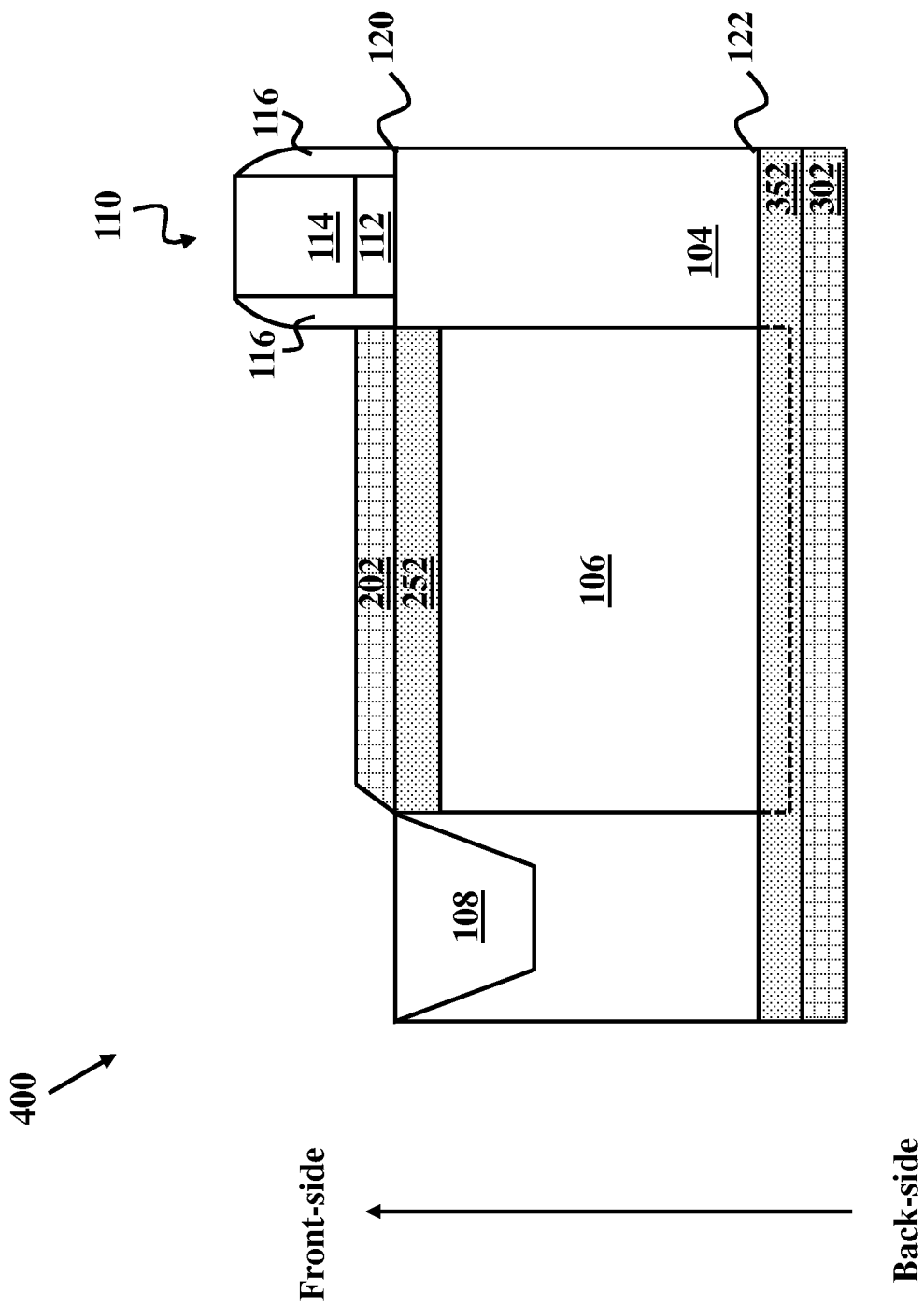

FIG. 4A is a diagrammatic sectional side view of a CIS device 400 including both the front passivation layer 202 and the back passivation layer 302. The front passivation layer 202 and the back passivation layer 302 are substantially similar to the the front passivation layer 202 and the back passivation layer 302 discussed with regard to FIGS. 2A-2B and 3A-3B.

Figure 4B:
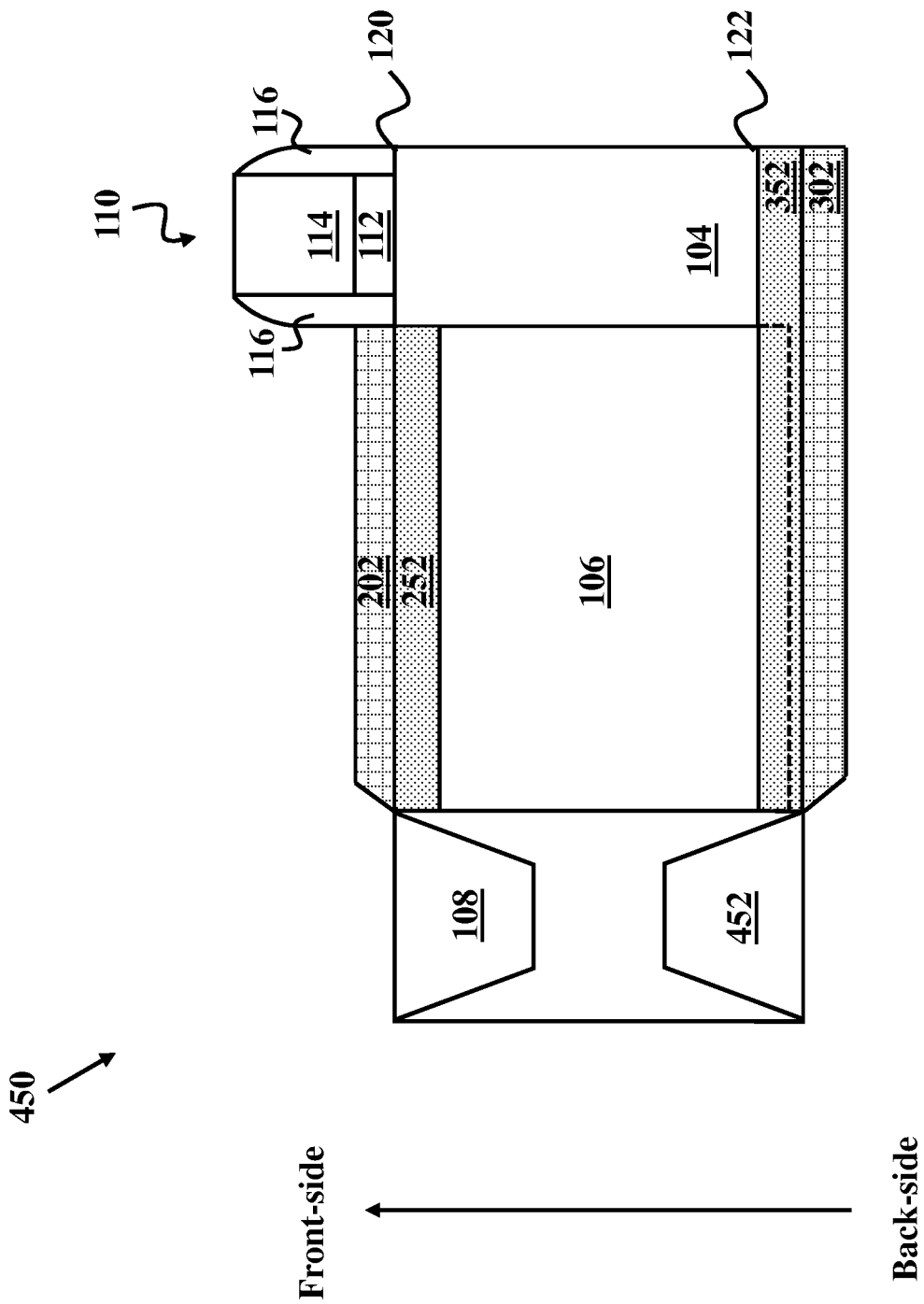

FIG. 4B is a diagrammatic sectional side view of a CIS device 450 including both the front passivation layer 202 and the back passivation layer 302. The CIS device 450 is substantially similar to the CIS device 400 of FIG. 4A except that, the CIS device 450 further includes a back isolation region 452. The back isolation region 452 is substantially similar to the isolation region 108 as discussed earlier in the present disclosure. The back isolation region 452 may be formed using a shallow trench isolation (STI) technique, to define and electrically isolate the various active regions. In some embodiments, the back isolation region 452 includes silicon oxide, silicon nitride, silicon oxynitride, an air gap, other suitable materials, or combinations thereof. In some embodiments, the isolation region 452 is formed before the formation of the back passivation layer 302. In some embodiments, the back surface of the back isolation region 452 is above the back surface of the back passivation layer 302.

Figure 5:
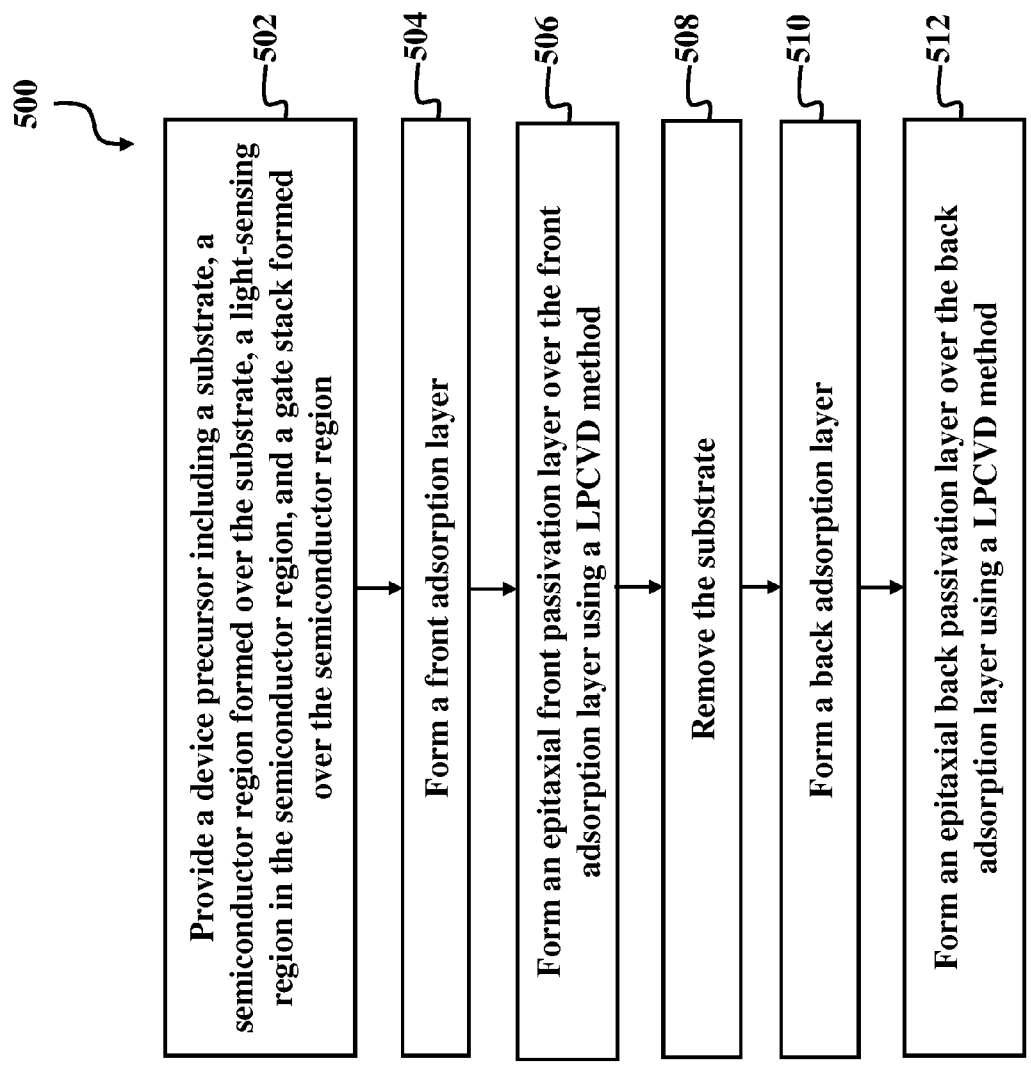
FIG. 5 is a flow chart showing an illustrative method for forming one or more passivation layers in a CIS device, in accordance with some embodiments.

FIG. 5 is a flow chart showing a method 500 for forming one or more passivation layers in a CIS device, e.g., a CIS device 400 as shown in FIG. 4A. Method 500 starts from step 502 by providing a device precursor including a substrate 102, a semiconductor region 104, a light-sensing region 106, and a gate stack 110. The device precursor may further include an isolation region 108 as shown in FIG. 1.

Method 500 proceeds to step 504 by forming the front adsorption layer 252. In some embodiments, the front adsorption layer 252 is epitaxially grown using a LPCVD process.

Method 500 proceeds to step 506 by forming the front passivation layer 202 over the front adsorption layer 252. In some embodiments, the front passivation layer 202 is epitaxially grown on the light-sensing region 106 using an in-situ low-pressure chemical vapor deposition (LPCVD) process by flowing precursor gases into a chamber. The surface of the device precursor may be cleaned using a hydrogen fluoride (HF) solution. A photo mask may also be formed to cover the gate stack 110 and/or the isolation region 108 to grow the front passivation layer 202 in a defined region on the light-sensing region 106.

Method 500 proceeds to step 508 by performing a thin down process to the substrate 102. In some embodiments, a thin down process is performed to the substrate 102 using a grinding process and/or a chemical mechanical polishing (CMP) process. The thin down process may also be performed using one or more etching processes.

Method 500 proceeds to step 510 by forming the back adsorption layer 352 that is substantially similar to the front adsorption layer 252. The back adsorption layer 352 may be epitaxially grown using a LPCVD process.

Method 500 further proceeds to step 512 by forming the back passivation layer 302 over the back adsorption layer 352. In some embodiments, the back passivation layer 302 is epitaxially grown on the back surface 122 of the semiconductor region 104 using an in-situ low-pressure chemical vapor deposition (LPCVD) process. The surface of the device precursor may be cleaned using a hydrogen fluoride (HF) solution.

The present embodiments describe mechanisms for forming one or more passivation layers in a CMOS Image Sensor (CIS) device using an epitaxy growth process. Since the passivation layer discussed in the present disclosure is prepared using an epitaxy growth, the mechanisms provide less damage to the CIS device. The passivation layer formed using the epitaxy growth can provide reduced roughness at the interface, and improved crystallinity. The mechanisms can also provide high concentration of B dopants to the passivation layer by using the epitaxy growth, and the high B dopant concentration enables improved CIS device performance. The mechanisms also provides low thermal budget.

The present disclosure provides a complimentary metal-oxide-semiconductor (CMOS) image sensor (CIS) device. In accordance with some embodiments, the device includes a semiconductor region having a front surface and a back surface; a light-sensing region extending from the front surface towards the back surface within the semiconductor region; a gate stack formed over the semiconductor region; and at least one epitaxial passivation layer disposed at least one of over and below the light-sensing region. In some embodiments, the at least one epitaxial passivation layer includes a p-type doped silicon (Si) layer.

The present disclosure provides a method for forming a complimentary metal-oxide-semiconductor (CMOS) image sensor (CIS) device. The method includes providing a device precursor including a semiconductor region formed over a substrate, and a light-sensing region extending from a front surface towards a back surface of the semiconductor region; forming a front adsorption layer in the light-sensing region below the front surface; and growing a front passivation layer epitaxially over the front adsorption layer using a low-pressure chemical vapor deposition (LPCVD) method. In some embodiments, the front passivation layer includes a p-typed doped silicon (Si) layer.

The present disclosure provides a method for forming a complimentary metal-oxide-semiconductor (CMOS) image sensor (CIS) device. The method includes providing a device precursor including a semiconductor region formed over a substrate, and a light-sensing region extending from a front surface towards a back surface within the semiconductor region; forming a front adsorption layer in the light-sensing region; growing a front passivation layer epitaxially on the front adsorption layer; performing a thin down process to the substrate; forming a back adsorption layer in the semiconductor region under the back surface; and growing a back passivation layer epitaxially on the back adsorption layer. In some embodiments, the at least one of the front passivation layer and the back passivation layer includes a boron (B) doped silicon (Si) layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A complimentary metal-oxide-semiconductor (CMOS) image sensor (CIS) device, comprising:
   a semiconductor region having a front surface and a back surface;
   a light-sensing region extending from the front surface towards the back surface within the semiconductor region;
   a first passivation layer disposed over the light-sensing region; and
   a gate stack formed over an area of the semiconductor region that is free of the first passivation layer,
   wherein the first passivation layer includes a p-type doped silicon (Si) layer, and
   wherein the semiconductor region includes a front adsorption layer, the first passivation layer being disposed on the front adsorption layer.

2. The device of claim 1, wherein the p-type doped Si layer includes a boron (B) doped Si layer.

3. The device of claim 2, wherein a concentration of dopants B in the B doped Si layer is in a range from about $10^{15}$ atom/cm$^3$ to about $10^{21}$ atom/cm$^3$.

4. The device of claim 1, wherein the p-type doped Si layer further includes carbon (C) dopants with a concentration of p-type dopants and the C dopants in a range from about $10^{15}$ atom/cm$^3$ to about $10^{21}$ atom/cm$^3$.

5. The device of claim 1, wherein the first passivation layer has a thickness in a range from about 10 nm to about 20 nm.

6. The device of claim 1, wherein the first passivation layer includes one or more crystal facets on an edge of the front passivation layer, the one or more crystal facets being selected from the group consisting of (001), (111), and (311).

7. The device of claim 1, wherein the front adsorption layer includes a SiGe layer.

8. The device of claim 1, wherein the front adsorption layer includes an n-type doped SiGe layer, and wherein the n-type doped SiGe layer includes a phosphor (P) doped SiGe layer.

9. The device of claim 1, wherein the semiconductor region includes a P doped SiGe layer, and the front adsorption layer is an intrinsic SiGe layer disposed on the P doped SiGe layer, and
   wherein a concentration of Ge in the P doped SiGe layer and the intrinsic SiGe layer increases from a range from about 1% to about 10%, to a range from about 30% to about 100% along a direction extending from a backside towards a front-side.

10. The device of claim 1, wherein the semiconductor region includes a back adsorption layer.

11. The device of claim 10, wherein the back adsorption layer includes a SiGe layer.

12. The device of claim 10, wherein the back adsorption layer includes an n-type doped SiGe layer, and wherein the n-type doped SiGe layer includes a phosphor (P) doped SiGe layer.

13. The device of claim 9, further comprising
   a front isolation region disposed below the front surface; and
   a back isolation region disposed above the back surface.

14. A complimentary metal-oxide-semiconductor (CMOS) image sensor (CIS) device, comprising:
   a semiconductor region having a front surface and a back surface;
   a light-sensing region extending from the front surface towards the back surface within the semiconductor region;
   a first passivation layer disposed over a first surface of the light-sensing region, wherein the first passivation layer includes one of: a p-type doped silicon (Si) layer and a high-k dielectric layer;
   a second passivation layer disposed over a second surface of the light-sensing region, wherein the second passivation layer includes one of: a p-type doped silicon (Si) layer and a high-k dielectric layer;
   first and second adsorption layers, wherein the first and second adsorption layers each include SiGe, the first adsorption layer is disposed between the first passivation layer and the first surface, and the second adsorption layer is disposed between the second passivation layer and the second surface; and
   a gate stack disposed over an area of the semiconductor region that is free of the first passivation layer.

15. A complimentary metal-oxide-semiconductor (CMOS) image sensor (CIS) device, comprising:
   a semiconductor region having a front surface and a back surface;
   a light-sensing region extending from the front surface towards the back surface within the semiconductor region;
   a first adsorption layer disposed over a first surface of the light-sensing region; and
   a first passivation layer disposed over the first adsorption layer,
   wherein the first passivation layer includes p-type doped silicon (Si) and the first adsorption layer includes SiGe.

16. The device of claim 15, wherein the first surface of the light-sensing region is substantially coplanar with the front surface of the semiconductor region.

17. The device of claim 15, further comprising:
   a second adsorption layer disposed over a second surface of the light-sensing region; and
   a second passivation layer disposed over the second adsorption layer,
   wherein the second passivation layer includes p-type doped silicon (Si) and the second adsorption layer includes SiGe.

18. The device of claim 15, wherein a front surface of the first adsorption layer is substantially coplanar with the front surface of the semiconductor region.

19. The device of claim 15, wherein a front surface of the first passivation layer is substantially coplanar with the front surface of the semiconductor region.

20. The device of claim 15, further comprising:
   a gate stack formed over the front surface of the semiconductor region, wherein the first passivation layer is not disposed over the gate stack.

* * * * *